(12) United States Patent
Heima et al.

(10) Patent No.: US 6,850,120 B2
(45) Date of Patent: Feb. 1, 2005

(54) SEMICONDUCTOR DEVICE INCLUDING SEMICONDUCTOR ELEMENT OF HIGH BREAKDOWN VOLTAGE

(75) Inventors: Tetsuya Heima, Hyogo (JP); Hiroshi Komurasaki, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/308,058

(22) Filed: Dec. 3, 2002

(65) Prior Publication Data

US 2003/0155980 A1 Aug. 21, 2003

(30) Foreign Application Priority Data

Feb. 15, 2002 (JP) ........................................ 2002-038459

(51) Int. Cl.[7] .............................................. H03F 1/22
(52) U.S. Cl. ...................................... 330/311; 330/285
(58) Field of Search .......................... 330/98, 253, 285, 330/296, 310, 311

(56) References Cited

U.S. PATENT DOCUMENTS 6,122,532 A * 9/2000 Taylor ........................ 330/296
6,133,793 A * 10/2000 Lau et al. .................... 330/310
6,392,490 B1 * 5/2002 Gramegna et al. .......... 330/311
6,556,085 B2 * 4/2003 Kwon et al. ................. 330/311

FOREIGN PATENT DOCUMENTS

| JP | 50-17992 | 2/1975 |
| JP | 60-20559 | 2/1985 |

* cited by examiner

*Primary Examiner*—Khanh Van Nguyen
(74) *Attorney, Agent, or Firm*—McDermott Will & Emery LLP

(57) ABSTRACT

A first NMOS transistor has its source connected to ground and its drain connected to the source of a second NMOS transistor of high breakdown voltage via an inductor. The second NMOS transistor of high breakdown voltage has its drain connected to a power supply line Vdd via the inductor. An output Vout is provided from the drain of the second NMOS transistor. When an input voltage Vin is applied to the gate of the first NMOS transistor and a bias voltage Vg2 is applied to the gate of the second NMOS transistor, the first and second NMOS transistors operate. The voltage amplitude of the load end of the second NMOS transistor of high breakdown voltage connected to the inductor swings about the power supply voltage. The voltage amplitude increases as the output voltage becomes higher.

4 Claims, 2 Drawing Sheets

SEMICONDUCTOR DEVICE INCLUDING SEMICONDUCTOR ELEMENT OF HIGH BREAKDOWN VOLTAGE

BACKGROUND OF THE INVENTION

1. Field of the Invention

The present invention relates to a semiconductor device including a semiconductor element of a high breakdown voltage. More particularly, the present invention relates to a semiconductor device having an active element of low speed performance and high breakdown voltage combined with an active element of high speed performance and low breakdown voltage to operate in high performance and high breakdown voltage.

2. Description of the Background Art

Recently, it has become possible to fabricate high frequency (RF) circuits using CMOS semiconductors according to the submicron technology of semiconductors. However, it has become difficult to satisfy both the requirement of favorable performance and reliability for voltage control oscillators (VCO), mixers (MIX), power amplifiers (PA) and the like of high voltage since the gate breakdown voltage between the gate and drain is reduced by microminiaturization.

In view of the foregoing, the approach of connecting CMOS semiconductor devices in a cascade manner shown in FIG. 3 has been employed. Specifically, to an NMOS transistor 1 having an input voltage Vin applied to its gate, a same NMOS transistor 2 is cascade-connected. An inductor 3 is connected between the drain of NMOS transistor 2 and the power supply line as a load. An output signal Vout is provided from the drain of NMOS transistor 2.

In the circuit shown in FIG. 3, the voltage amplitude of the drain of NMOS transistor 2 to which inductor 3 is connected swings about the power supply voltage. This voltage amplitude becomes greater in proportion to greater power. During this great voltage amplitude, a potential difference greater than the power supply voltage is generated between the gate-drain of the upper stage NMOS transistor 2. There is a limit in raising the gate breakdown voltage. The gate breakdown voltage will be insufficient, so that the reliability cannot be satisfied.

SUMMARY OF THE INVENTION

A main object of the present invention is to provide a semiconductor device including a semiconductor element of high breakdown voltage that operates in high performance and high breakdown voltage.

According to an aspect of the present invention, a semiconductor device includes a first transistor having a first conduction terminal to which a first voltage is applied and a second conduction terminal, rendered electrically conductive therebetween, a second transistor of a breakdown voltage higher than that of the first transistor, and having third and fourth conduction terminals rendered electrically conductive therebetween, a second voltage higher than the first voltage to the third conduction terminal of the second transistor through a load element, and a passive element connected between the second conduction terminal of the first transistor and the fourth conduction terminal of the second transistor.

According to another aspect of the present invention, a semiconductor device includes a first transistor having first and second conduction terminals rendered electrically conductive therebetween, a second transistor of a breakdown voltage higher than that of the first transistor, and having a third conduction terminal connected to the second conduction terminal of the first transistor and a fourth conduction terminal, rendered electrically conductive therebetween, and a third transistor of a breakdown voltage higher than that of the first transistor, having a fifth conduction terminal connected to the second conduction terminal of the first transistor in parallel with the second transistor and a sixth conduction terminal, rendered electrically conductive therebetween.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
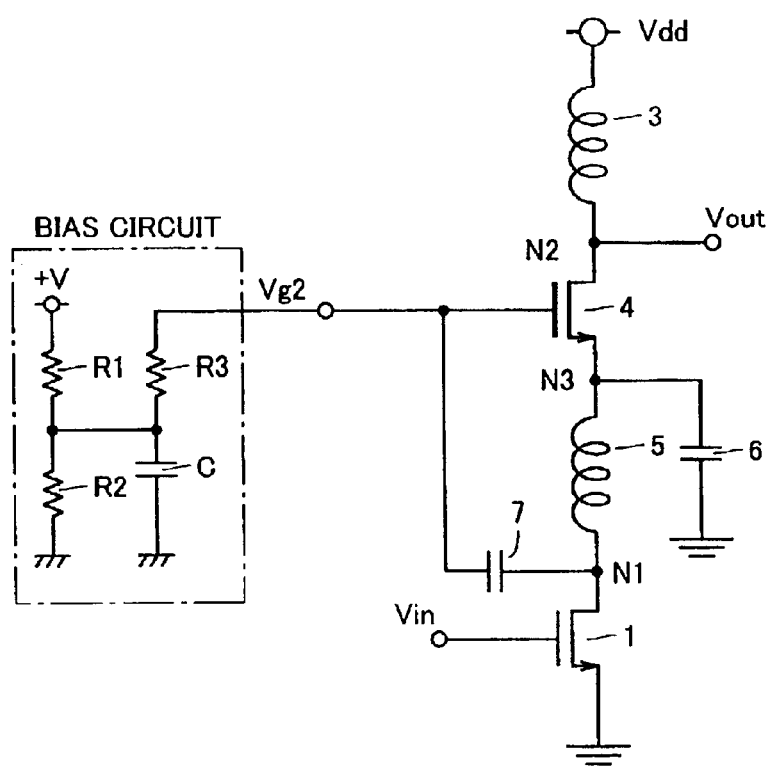
FIG. 1 is a circuit diagram of a power amplifier of the type utilizing current according to an embodiment of the present invention.

Referring to FIG. 1, a high breakdown voltage NMOS transistor 4 which is a second transistor having a high gate breakdown voltage selected is cascade-connected to an NMOS transistor 1 which a first transistor of a normal gate breakdown voltage via an inductor 5 which is a passive element. Specifically, NMOS transistor 1 has its source which is the first conduction terminal connected to ground that corresponds to the first potential, and its drain which is the second conduction terminal connected to the source which is the fourth conduction terminal of NMOS transistor 4 via inductor 5 and a node N3 from a node N1. NMOS transistor 4 has its drain which is the third conduction terminal connected to the power supply line via inductor 3 which is a load from a node N2. An output Vout is provided from the drain of NMOS transistor 4. A decoupling capacitor 6 is connected between the source of NMOS transistor 4 and ground. A capacitor 7 is connected between the drain of NMOS transistor 1 and the gate which is a control terminal of NMOS transistor 4.

A bias circuit is connected to the gate of NMOS transistor 4. The bias circuit has resistors R1 and R2 connected between the power supply line and ground, and a capacitor C connected between the connection node of resistors R1 and R2 and ground. The bias circuit is configured so that a divided voltage is output as a bias voltage Vg2 via resistor R3 from the connection node. Bias voltage Vg2 is applied to the gate of NMOS transistor 4 of high breakdown voltage.

The operation of the embodiment shown in FIG. 1 will be described here. An RF signal Vin of high frequency is applied to the gate of NMOS transistor 1. NMOS transistor 1 and inductor 5 amplify the RF signal to obtain an amplified RF signal at node N1. This RF signal at node N1 is applied to the gate of NMOS transistor 4 to be further amplified by NMOS transistor 4 and inductor 3 which is a load element thereof. The amplified RF signal Vout is obtained at node N2.

Capacitor 7 functions as a coupling capacitor to apply to the input terminal of NMOS transistor 4 a signal having the DC component removed from the RF signal of node N1. Capacitor 6 applies the ground voltage corresponding to the high frequency component to the source (node N3) of NMOS transistor 4. Accordingly, a power supply voltage of an amplifier circuit formed of transistor 1 and inductor 5 is generated at node N3. This power supply voltage is lower in level than power supply voltage Vdd connected to inductor 3. Therefore, an RF signal that swings about the power supply voltage of N3 is obtained.

Bias voltage Vg2 is applied to the gate of NMOS transistor 4. In order to operate NMOS transistor 4 of high breakdown voltage, the RF signal output from node N1 is biased into an RF signal that swings about bias voltage Vg2.

Figure 3:
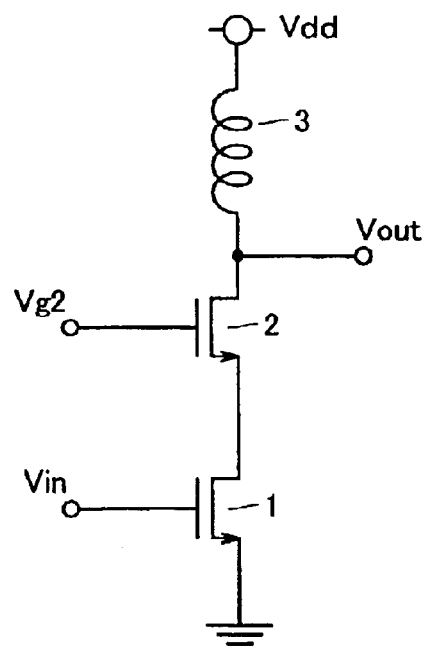
FIG. 3 is a circuit diagram of a conventional cascade type power amplifier.

If the amplifier is configured conventionally of only the normal high performance elements as shown in FIG. 3, the breakdown voltage is insufficient, and reliability cannot be satisfied. In the embodiment of the present invention, an NMOS transistor 4 of high breakdown voltage is cascade-connected to NMOS transistor 1 via inductor 5. Therefore, the breakdown voltage is high enough even if there is a potential difference greater than the power supply voltage between the gate-drain of NMOS transistor 4. As a result, the breakdown voltage is improved and high power output is allowed. Power consumption can be reduced.

Figure 2:
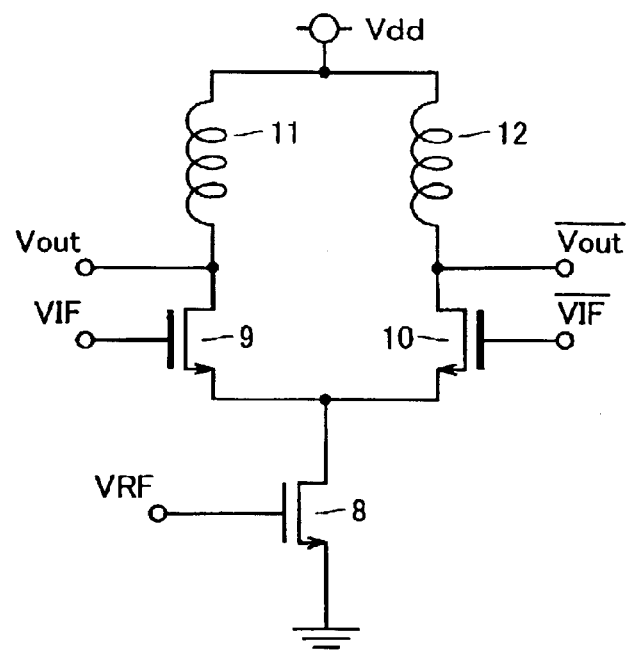
FIG. 2 is a circuit diagram of a mixer circuit according to another embodiment of the present invention.

FIG. 2 is a circuit diagram of a mixer circuit as a semiconductor device according to another embodiment of the present invention. Referring to FIG. 2, an NMOS transistor 8 is a transistor of the normal breakdown voltage. A high frequency signal VRF is applied to the gate of NMOS transistor 8. The source of NMOS transistor 8 which is the first conduction terminal is connected to ground. NMOS transistor 8 has its drain which is the second conduction terminal connected to the sources of NMOS transistors 9 and 10 of high breakdown voltage, which are the third and fifth conduction terminals, respectively. NMOS transistors 9 and 10 of high breakdown voltage form a differential circuit. An intermediate frequency signal VIF and an inverted signal thereof /VIF (/indicates inversion) are applied to respective gates of NMOS transistors 9 and 10, which are control terminals. Inductors 11 and 12 are connected between the drains of NMOS transistors 9 and 10, which are the fourth and sixth conduction terminals, respectively, and the power supply line. Complementary output voltages Vout and /Vout are output from respective drains of NMOS transistors 9 and 10.

Although NMOS transistor 8 operates according to high frequency signal VRF, the amplitude of the output voltage at its drain is small. Therefore, the breakdown voltage of the element per se may be small. NMOS transistors 9 and 10 of high breakdown voltage operate according to intermediate frequency signal VIF and inverted signal /VIF applied to respective gates. Although a potential difference larger than the power supply voltage is generated between each gate and drain, the breakdown voltage is sufficient.

High frequency signal VRF is a signal of the frequency of 1 GHz or higher. Intermediate frequency signals IF and /IF are signals of frequency lower than high frequency signal VRF. For example, intermediate frequency signals IF and /IF have a frequency of 100 MHz or below. A signal having a frequency component of (X+Y) and (Y−Y) is obtained from outputs Vout and /Vout, respectively, where X is the frequency of high frequency signal VRF and Y is the frequency of intermediate frequency signal VIF.

Although the above embodiments were described in which a semiconductor device is configured using MOS transistors, it will be understood that such description is merely exemplary, and a bipolar transistor can be used in the present invention. In this case, the second and third transistors have a breakdown voltage of the collector and emitter higher than that of the first transistor.

According to the embodiment of the present invention, a semiconductor device that operates in high performance and high breakdown voltage can be realized by including a first transistor having a first conduction terminal to which a first voltage is applied and a second conduction terminal, rendered electrically conductive therebetween, a second transistor of a breakdown voltage higher than that of the first transistor, and having a third conduction terminal to which a second voltage higher than the first voltage is applied via a load element and a fourth conduction terminal, rendered electrically conductive therebetween, and a passive element connected between the second conduction terminal of the first transistor and the fourth conduction terminal of the second transistor.

Also, a semiconductor device such as a mixer circuit that operates in higher performance and high breakdown voltage can be realized by including a first transistor having first and second conduction terminal rendered electrically conductive therebetween, a second transistor of a breakdown voltage higher than that of the first transistor, and having a third conduction terminal connected to the second conduction terminal of the first transistor and a fourth conduction terminal, rendered electrically conductive therebetween, and a third transistor of a breakdown voltage higher than that of the first transistor, and having a fifth conduction terminal connected to the second conduction terminal of the first transistor in parallel with the second transistor and a sixth conduction terminal, rendered electrically conductive therebetween.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including a semiconductor element of high breakdown voltage, comprising:

a first transistor including first and second conduction terminals rendered electrically conductive therebetween, said first conduction terminal having a first voltage applied;

a second transistor of a breakdown voltage higher than the breakdown voltage of said first transistor, and including third and fourth conduction terminals rendered electrically conductive therebetween, a second voltage higher than said first voltage to the third conduction terminal of said second transistor through a load element; and a passive element connected between the second conduction terminal of said first transistor and the fourth conduction terminal of said second transistor.

2. The semiconductor device including a semiconductor element of high breakdown voltage according to claim 1, further comprising a first capacitor connected between the second conduction terminal of said first transistor and a control terminal that controls conduction of said second transistor, wherein said first voltage is applied to the fourth conduction terminal of said second transistor through a second capacitor.

3. A semiconductor device including a semiconductor element of high breakdown voltage, comprising:

a first transistor including first and second conduction terminals rendered electrically conductive therebetween;

a second transistor of a breakdown voltage higher than the breakdown voltage of said first transistor, including third and fourth conduction terminals rendered electrically conductive therebetween, said third conduction terminal being connected to the second conduction terminal of said first transistor; and a third transistor of a breakdown voltage higher than the breakdown voltage of said first transistor, including fifth and sixth conduction terminals rendered electrically conductive therebetween, said fifth conduction terminal being connected to the second conduction terminal of said first transistor in parallel with said second transistor.

4. The semiconductor device including a semiconductor element of high breakdown voltage according to claim 3, wherein said first voltage is applied to the first conduction terminal of said first transistor, a second voltage higher than said first voltage is applied to the fourth conduction terminal of said second transistor through a first load element, said second voltage is applied to the sixth conduction terminal of said third transistor through a second load element, a first signal is applied to a control terminal controlling conduction of said first transistor, and two signals having a component of a frequency lower than the frequency of said first signal are respectively applied to control terminals controlling conduction of said second and third transistors.

* * * * *